(12) United States Patent
Lee et al.

(10) Patent No.: US 6,707,653 B2
(45) Date of Patent: Mar. 16, 2004

(54) SEMICONDUCTOR CONTROLLED RECTIFIER FOR USE IN ELECTROSTATIC DISCHARGE PROTECTION CIRCUIT

(75) Inventors: Dong-Jin Lee, Seoul (KR); Ki-Whan Song, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/251,979

(22) Filed: Sep. 23, 2002

(65) Prior Publication Data

US 2003/0081362 A1 May 1, 2003

(30) Foreign Application Priority Data

Oct. 30, 2001 (KR) .......................................... 2001-67178

(51) Int. Cl.$^7$ ................................................ H02H 9/00
(52) U.S. Cl. .......................... 361/56; 361/58; 361/111; 257/173
(58) Field of Search .......................... 361/56, 58, 91.1; 257/111, 173

(56) References Cited

U.S. PATENT DOCUMENTS

| 5,455,436 | A | | 10/1995 | Cheng |
| 5,465,189 | A | | 11/1995 | Polgreen et al. |
| 5,872,379 | A | | 2/1999 | Lee |
| 6,476,422 | B1 | * | 11/2002 | Yu .............................. 257/173 |

FOREIGN PATENT DOCUMENTS

JP      7263633      10/1995

* cited by examiner

Primary Examiner—Stephen W. Jackson
Assistant Examiner—James A Demakis
(74) Attorney, Agent, or Firm—Volentine Francos, PLLC

(57) ABSTRACT

An electrostatic discharge (ESD) protection circuit includes an MOS transistor acting as a trigger for the circuit. A drain region of the MOS transistor is formed by an N-type heavily doped impurity region which overlaps an N-type well region. Further, a P-type heavily doped impurity region is formed in the N-type well region. The N-type and P-type heavily doped impurity regions are electrically connected to an input/output pad. The ESD protection circuit exhibits a reduced input capacitance at the pad, and a reduced breakdown voltage of the MOS transistor.

8 Claims, 3 Drawing Sheets

SEMICONDUCTOR CONTROLLED RECTIFIER FOR USE IN ELECTROSTATIC DISCHARGE PROTECTION CIRCUIT

BACKGROUND OF THE INVENTION

1. Field of the Invention

The present invention relates to a semiconductor integrated circuit and, more particularly, to a device for protecting against electrostatic discharge in a low-voltage semiconductor integrated circuit.

2. Background of the Invention

Semiconductor integrated circuits fabricated from complementary metal-oxide-semiconductor (CMOS) technology are very sensitive to high-voltage static electricity (or electrostatic discharge) resulting from, for example, human contact. The electrostatic discharge (ESD) can cause an integrated circuit chip to be inoperable, for example, by breaking a thin insulating film of the chip or short circuiting a channel of the chip. Accordingly, ESD protection circuits are conventionally incorporated at the input circuitry of the integrated circuit chip. These ESD protection circuits serve to discharge a transient high voltage or transient high current before the transient high voltage or transient high current enters into other circuits of the chip. ESD protection circuits are often essential to secure reliable semiconductor products, and high-performance ESD protecting circuits are required in high-integration/high-speed semiconductor products.

It has been reported that a semiconductor controlled rectifier (SCR) provides good protection characteristics when adopted as an ESD protection circuit. Since the PNP and NPN bipolar transistors of the SCR give rise to positive-feedback in an electrostatic event, the discharge capacity of the SCR is favorable. Further, because hot-carrier paths are not locally concentrated, a heat generating area is decentralized.

An operational characteristic of an SCR-structured ESD protection circuit is dependent upon the speed at which the SCR is triggered (turned on) at a given voltage. One example of an SCR-structured ESD protection circuit is disclosed in U.S. Pat. No. 5,872,379, entitled "LOW VOLTAGE TURN-ON SCR FOR ESD PROTECTION", which is incorporated in its entirety by reference herein. Other examples of SCR-structured ESD protection circuits are disclosed in U.S. Pat. No. 5,455,436, entitled "PROTECTION CIRCUIT AGAINST ELECTROSTATIC DISCHARGE USING SCR STRUCTURE", and U.S. Pat. No. 5,465,189, entitled "LOW VOLTAGE TRIGGERING SEMICONDUCTOR CONTROLLED RECTIFIERS".

An SCR-structured ESD protection circuit described in the aforementioned U.S. Pat. No. 5,872,379 is illustrated in FIG. 1. As shown, an ESD protection circuit 10 is constructed at a P-type semiconductor substrate 12 in which an N-type well region 28 is formed. A heavily doped P-type impurity region 34 and a heavily doped N-type impurity region 32 are formed in the N-type well region 28. The impurity regions 32 and 34 are commonly electrically connected to a pad 30. At an interface between the P-type substrate 12 and the N-type well region 28, a heavily doped N-type region 20 is formed overlapping the N-type well region 28. A heavily doped P-type impurity region 14 is formed in the P-type substrate 12, and a heavily doped N-type impurity region 18 is formed in the P-type substrate 12 between the heavily doped P-type region 14 and the heavily doped N-type impurity region 20. A gate electrode 24 is formed on a semiconductor substrate between the heavily N-type impurity regions 18 and 20. A thin oxide film 22 is formed between the gate electrode 24 and the P-type substrate 12. The heavily doped P-type impurity region 14, the heavily doped N-type impurity region 18, and the gate electrode 22 are electrically connected to a ground voltage Vss through a contact or bus 16.

The heavily doped N-type impurity region 18, the heavily doped N-type impurity region 20, and the gate electrode 24 constitute an NMOS transistor 26. The heavily doped N-type impurity region 18 is used as a source electrode, and the heavily doped N-type impurity region 20 is used as a drain electrode. The ground voltage Vss is connected to the gate electrode 24, keeping the SCR in an OFF state during a normal operation. Since the SCR is kept OFF, the NMOS transistor 26 will treat any positive or negative electrostatic discharge stress that is generated between the ground voltage Vss on the bus 16 and a voltage of the heavily doped N-type impurity region 20.

When there is an excessive stress in the heavily doped N-type impurity region 20 or the pad 30, the heavily doped N-type impurity regions 18 and 20 and underlying P-type substrate 12 act as a bipolar device. The PN junction (20, 12) is broken down at, for example, 15V to provide a protection function for the internal circuits. Electrons produced by the breakdown of the PN junction (20, 12) are swept into the heavily doped N-type impurity region 20 acting as a collector region. Due to holes injected into a base region 12, a substrate voltage is increased to forward bias the emitter junction (12, 18) and turn on an NPN transistor of the SCR. As a result, electrons are increasingly injected into the base 12 from the emitter 18. The electrons reaching the collector-base junction (20, 12) create new electron-hole pairs to continuously increase the current. Such positive feedback causes the emitter-to-collector current to indefinitely increase.

In the case of the SCR-structured ESD protection circuit 10 shown in FIG. 1, the heavily doped P-type impurity region 34 and the heavily doped N-type impurity region 32 are formed in the N-type well region 28, and the heavily doped N-type impurity region 20 is formed overlapping the N-type well region 28. This means that the well 28 must be of a relatively large area. However, as the area of the N-type well region 28 of the EDS protection circuit increases, an input capacitance of the pad 30 (or a parasitic capacitance of the ESD protection circuit) also increases. As a result, the integration level of the semiconductor integrated circuit and a drive capacity of an input/output circuit are reduced.

Further, in the case of the conventional SCR-structured ESD protection circuit, a breakdown voltage of the PN junction, as a trigger voltage, becomes higher than an original breakdown voltage due to a voltage drop caused by a resistance of the N-type well region. This means the trigger voltage of the SCR increases to a level of the voltage drop caused by the well resistance.

SUMMARY OF THE INVENTION

An objective of the present invention is to provide an SCR-structured ESD protection circuit having a reduced input capacitance.

Another objective of the present invention is to provide an SCR-structured ESD protection circuit having a reduced trigger voltage.

According to one aspect of the present invention, a circuit for protecting a semiconductor integrated circuit coupled to a first node includes a semiconductor substrate, a lightly doped region, a gate electrode, and first to sixth heavily doped regions. The lightly doped region is of a first conductivity type (e.g., N-type) and is formed in the semiconductor substrate which is of a second conductivity type (e.g., P-type). The first heavily doped region is of the second conductivity type, and is coupled directly to the first node and formed in the lightly doped region. The second heavily doped region is of the first conductivity type, and is coupled directly to the first node and formed overlapping the lightly doped region. The third heavily doped region is of the first conductivity type, and is formed in the semiconductor substrate adjacent to the second heavily doped region of the first conductivity type. The gate electrode is electrically connected to a second node and is formed on the semiconductor substrate between the second heavily doped region and the third heavily doped region. The fourth heavily doped region is of the second conductivity type, and is electrically connected to the second node and formed in the semiconductor substrate opposite to the second heavily doped region of the first conductivity type. The fifth heavily doped region is of the first conductivity type, and is electrically connected to the second node and formed in the semiconductor substrate between the lightly doped region of the first conductivity type and the fourth heavily doped region of the second conductivity type. The sixth heavily doped region is of the second conductivity type, and is electrically connected to the third heavily doped region of the second conductivity type and formed in the semiconductor substrate between the fifth heavily doped region of the first conductivity type and the lightly doped region.

The gate electrode, the second heavily doped region, and the third heavily doped region constitute an MOS transistor having a predetermined breakdown voltage. The semiconductor substrate, the lightly doped region, and the first to sixth heavily doped regions constitute a semiconductor controlled rectifier which is turned on when a voltage applied to the first node reaches the breakdown voltage of the MOS transistor.

BRIEF DESCRIPTION OF THE DRAWINGS

The present invention will become more fully understood from the detailed description which follows, with reference to the accompanying drawings, in which embodiments are shown by way of non-limiting illustrations only, and in which.

DETAILED DESCRIPTION OF THE PREFERRED EMBODIMENT

Figure 2:
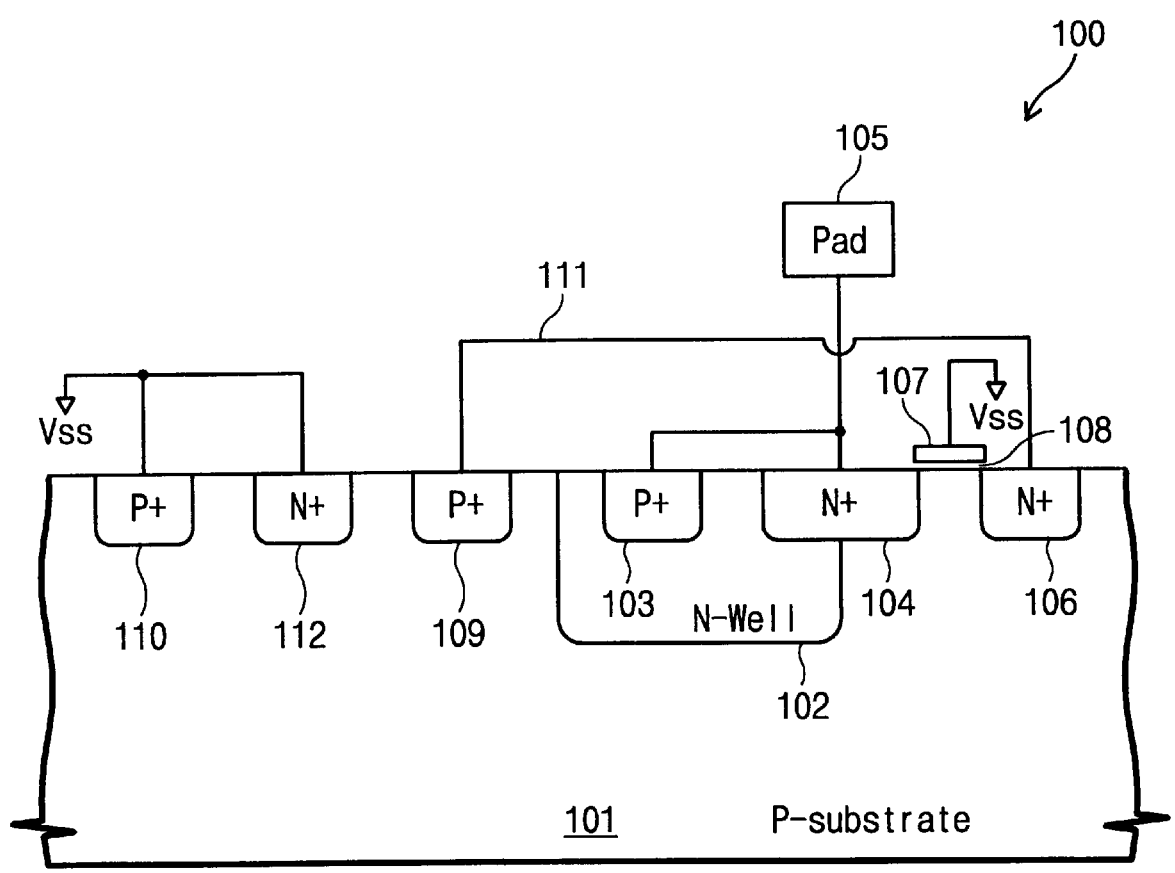
FIG. 2 is a cross-sectional view illustrating a semiconductor controlled rectifier (SCR) according to an embodiment of the present invention.

An exemplary configuration of an SCR-structured ESD protection circuit according to an embodiment of the invention is illustrated in FIG. 2. As shown, an ESD protection circuit 100 includes a first conductivity type (e.g., N-type) well region 102 formed in a second conductivity type (e.g., P-type) semiconductor substrate 101. A second conductivity type heavily doped impurity region 103 is formed in the well region 102. To the right of the second conductivity type heavily doped impurity region 103, a first conductivity type heavily doped impurity region 104 is formed at a boundary between the well region 102 and the semiconductor substrate 101, sufficiently overlapping the well region 102. The second conductivity type heavily doped impurity region 103 and the first conductivity type heavily doped impurity region 104 are electrically connected to an input/output pad 105. A first conductivity type heavily doped impurity region 106 is formed in the semiconductor substrate 101 adjacent to the first conductivity type heavily doped impurity region 104. A gate electrode 107 is connected to a ground voltage Vss and is formed over the semiconductor substrate 101 between the heavily doped impurity regions 104 and 106. A gate insulating layer 108 is formed between the gate electrode 107 and the semiconductor substrate 101. Second conductivity type heavily doped impurity regions 109 and 110 are formed in the semiconductor substrate 101 opposite to the first conductivity type heavily doped impurity region 106. The second conductivity type heavily doped impurity region 109 is electrically connected to the first conductivity type heavily doped impurity region 106 through a bus 111 or a contact. A first conductivity type heavily doped impurity region 112 is formed between the second conductivity type impurity regions 109 and 110. The second conductivity type heavily doped impurity region 110 and the first conductivity type heavily doped impurity region 112 are electrically connected to the ground voltage Vss.

As a voltage applied to the input/output pad 105 increases, the breakdown occurs at the NP junction of the heavily doped impurity region 104 and the semiconductor substrate 101. Electrons produced by the breakdown are swept into the heavily doped impurity region 104. Holes are produced by the breakdown and are injected into the heavily doped impurity region 109. As a result of the holes, a substrate voltage is increased to forward bias the emitter junction (101, 112) and turn on an NPN transistor of the SCR. As a result, electrons are increasingly injected into the base 101 from the emitter 112. The electrons reaching the collector-base junction (101, 102) create new electron-hole pairs to continuously increase the current. Such positive feedback causes the emitter-collector current to indefinitely increase.

Figure 1:
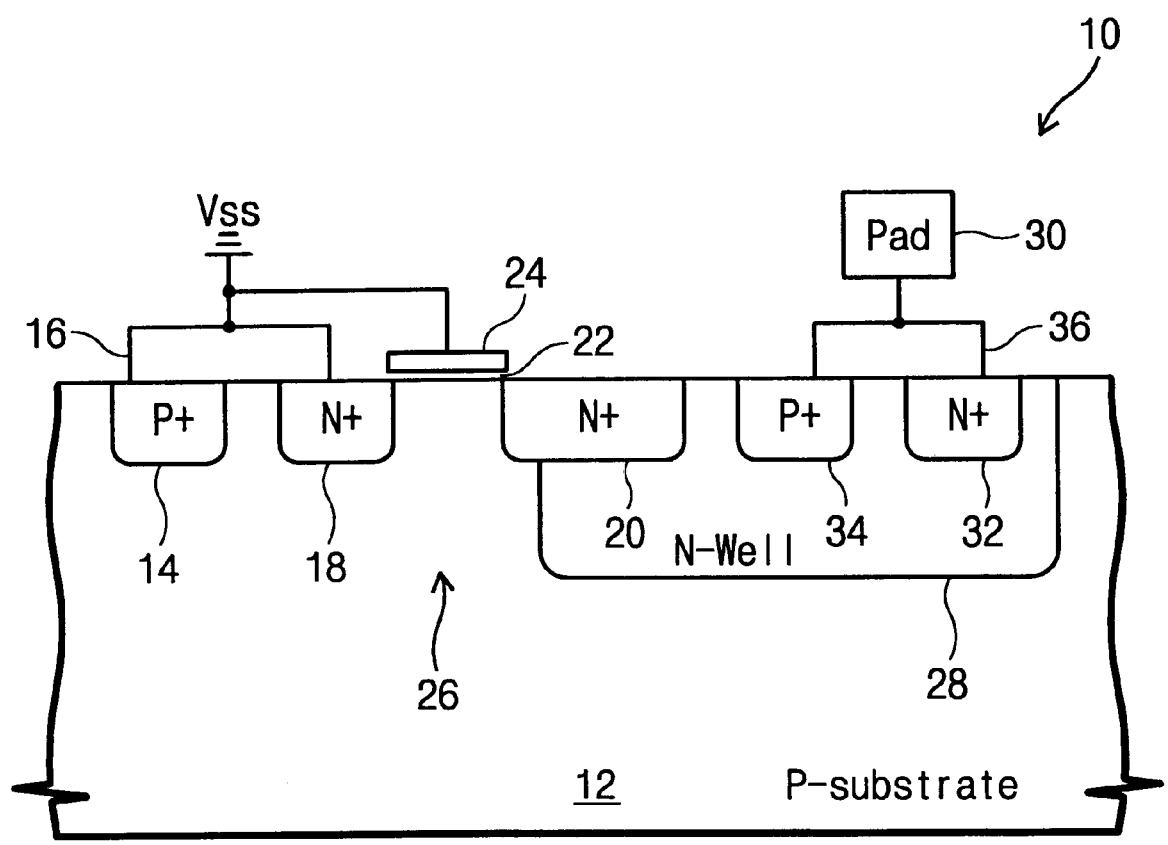
FIG. 1 is a cross-sectional view illustrating a semiconductor controlled rectifier (SCR) according to the prior art.

The SCR structure of FIG. 2 differs from that of prior art FIG. 1 in that the first conductivity type well region 102 of the SCR structure of FIG. 2 contains the second conductivity type heavily doped impurity region 103 and a part of the first conductivity type heavily doped impurity region 104. The first conductivity type heavily doped impurity region 104 has all functions of the heavily doped impurity regions 20 and 32 shown in FIG. 1. That is, the first conductivity type heavily doped impurity region 104 is connected to the input/output pad 105 and acts as a drain electrode of an MOS transistor including impurity regions 104 and 106 and a gate electrode 107. Accordingly, the well region 102 occupies a smaller area than the well region 28 shown in FIG. 1. As such, the ESD protection circuit according to the invention exhibits a reduced input capacitance of the input/output pad 105 relative to that of the circuit of FIG. 1. For example, the input capacitance of the input/output pad 105 may be reduced by about 30% when compared to that of FIG. 1.

Figure 3:
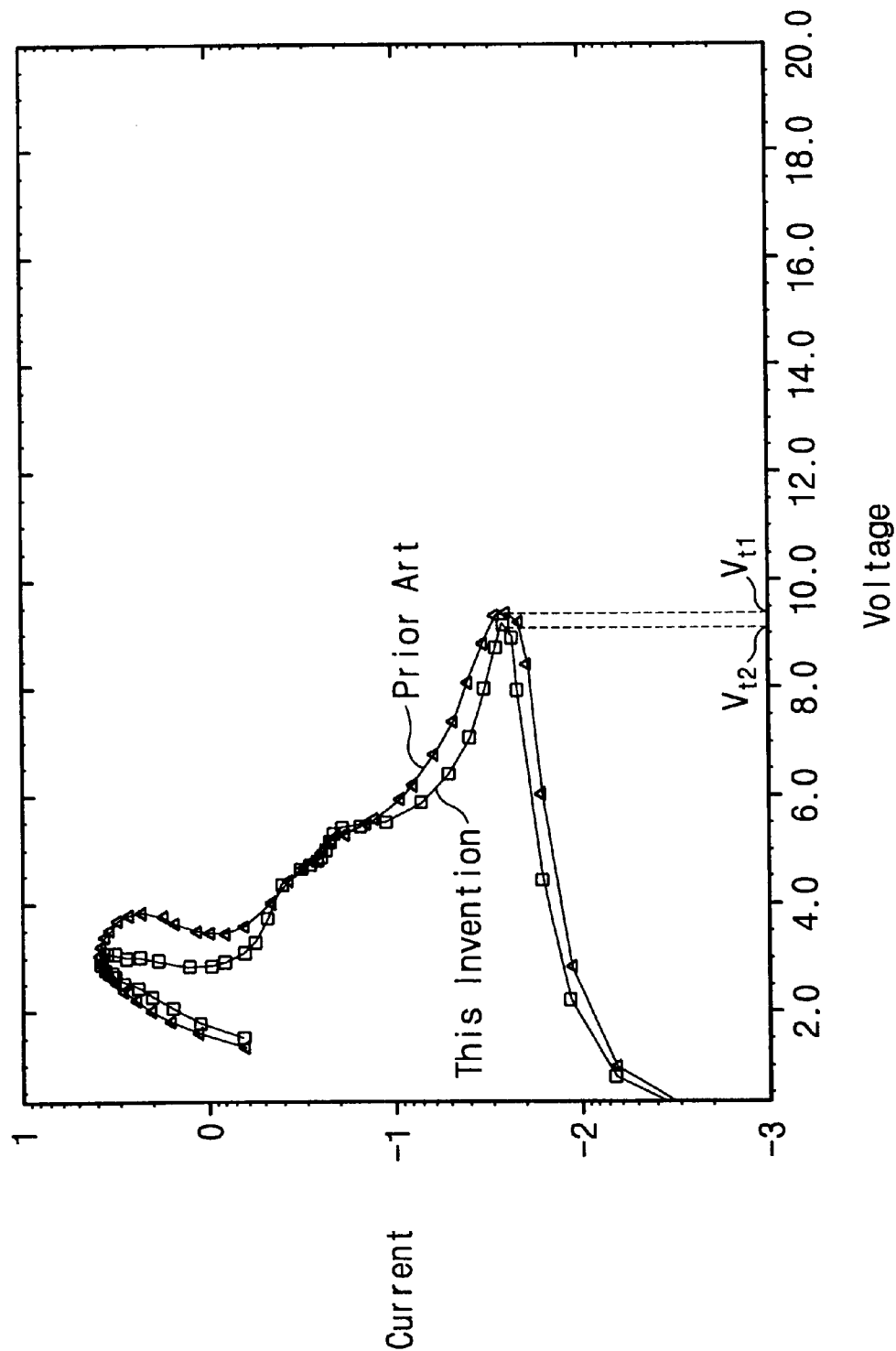
FIG. 3 is a graph illustrating a relationship between a pad voltage and a pad current in the SCR-structured ESD protection circuit of the prior art and in the SCR-structured ESD of the embodiment of the present invention.

FIG. 3 illustrates a relationship between a pad voltage and a pad current of the SCR-structured ESD protection circuits according to each of the prior art and the embodiment of the present invention. The results of FIG. 3 were obtained through a simulation test based on a machine model in which a width of an ESD protection circuit is 84 micrometers and an initial voltage of a pad is 300V. In FIG. 3, a transverse axis represents a pad voltage and a longitudinal axis is a current flowing to the pad. For reasons described below, a trigger voltage Vt2 of the SCR structure according to the invention is lower than a trigger voltage Vt1 of the SCR structure according to the prior art.

In the prior art, if a voltage is applied to an input/output pad, it is applied to a heavily doped impurity region 32 that is formed in a well region 28. A voltage drop occurs due to a resistance of the well area, so that a lower voltage than a pad voltage is applied a heavily doped impurity region 20 overlapping a well region 102. In the present invention, however, a pad voltage is directly applied to the heavily doped impurity region 104 overlapping a well region 102 in the absence of a voltage drop caused by a resistance of a well region. Thus, a trigger voltage is lowered.

According to the embodiment of the present invention, the heavily doped N-type and P-type impurity regions connected to an input/output pad are formed in a well region and formed overlapping the well region, respectively. Therefore, the well region occupies a smaller area to reduce an input capacitance of the pad. Further, a trigger voltage of the SCR structure is lowered because the NP junction is broken down at a lower voltage.

Therefore, the SCR structure according to the invention may be adopted to obtain a high-efficiency ESD protection circuit in which an input capacitance value of the pad is relatively small and a trigger voltage is relatively low.

Those skilled in the art may practice the principles of the present invention in other specific forms without departing from its spirit or essential characteristics. Accordingly, the disclosed embodiments of the invention are merely illustrative and do not serve to limit the scope of the invention set forth in the following claims.

What is claimed is:

1. A circuit for protecting a semiconductor integrated circuit coupled to a first node, comprising:
   a semiconductor substrate of a second conductivity type which is opposite a first conductivity type;
   a well region of the first conductivity type formed in the semiconductor substrate;
   a first region of the second conductivity type formed in the well region and directly electrically coupled to the first node;
   a second region of the first conductivity type formed at a boundary between the well region and the semiconductor substrate so as to overlap both the well region and the semiconductor substrate, wherein the second region is directly electrically coupled to the first node;
   a third region of the first conductivity type formed in the semiconductor substrate spaced from and adjacent to the second region outside the well region;
   a gate electrode formed over the semiconductor substrate between the second region and the third region, wherein the gate electrode is electrically connected to a second node;
   a fourth region of the second conductivity type formed in the semiconductor substrate spaced from the well region on an opposite side of the well region from the second region, wherein the fourth region is electrically connected to the second node;
   a fifth region of the first conductivity type which is electrically connected to the second node and which is formed in the semiconductor substrate spaced from and between the well region and the fourth region; and
   a sixth region of the second conductivity type which is electrically connected to the third region and which is formed in the semiconductor substrate spaced from and between the fifth region and the well region;
   wherein a dopant concentration of the first, fourth and sixth regions is greater than that of semiconductor substrate, and a dopant concentration of the second, third and fifth regions is greater than that of the well region.

2. The circuit as claimed in claim 1, wherein the gate electrode, the second region, and the third region constitute an MOS transistor having a given breakdown voltage.

3. The circuit as claimed in claim 2, wherein the semiconductor substrate, the well region, the first to sixth regions constitute a semiconductor controlled rectifier which is turned on when a voltage applied to the first node reaches the breakdown voltage of the MOS transistor.

4. The circuit as claimed in claim 1, wherein the first conductivity type is N-type and the second conductivity type is P-type.

5. The circuit as claimed in claim 1, wherein the first node is coupled to an input/output pad, and the second node is coupled to a ground voltage.

6. The circuit as claimed in claim 2, wherein the well region is an N-well, the semiconductor substrate is a P-type substrate, the first, fourth and sixth regions are P+ regions, and the second, third and fifth regions are N+ regions.

7. The circuit as claimed in claim 3, wherein the well region is an N-well, the semiconductor substrate is a P-type substrate, the first, fourth and sixth regions are P+ regions, and the second, third and fifth regions are N+ regions.

8. The circuit as claimed in claim 5, wherein the well region is an N-well, the semiconductor substrate is a P-type substrate, the first, fourth and sixth regions are P+ regions, and the second, third and fifth regions are N+ regions.

* * * * *